(12) United States Patent
Ohashi

(10) Patent No.: US 8,864,937 B2
(45) Date of Patent: Oct. 21, 2014

(54) SUBSTRATE TREATMENT APPARATUS

(75) Inventor: Yasuhiko Ohashi, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 571 days.

(21) Appl. No.: 12/492,571

(22) Filed: Jun. 26, 2009

(65) Prior Publication Data

US 2010/0032097 A1 Feb. 11, 2010

(30) Foreign Application Priority Data

Aug. 6, 2008 (JP) ................. 2008-202762

(51) Int. Cl.
*C23F 1/02* (2006.01)
*H01L 21/687* (2006.01)
*H01L 21/67* (2006.01)

(52) U.S. Cl.
CPC ...... *H01L 21/6708* (2013.01); *H01L 21/68742* (2013.01); *H01L 21/67051* (2013.01); *H01L 21/67034* (2013.01)
USPC ................ 156/345.55; 156/345.54

(58) Field of Classification Search
USPC ....................... 156/345.54, 345.55
See application file for complete search history.

(56) References Cited

U.S. PATENT DOCUMENTS

| 6,755,934 | B2* | 6/2004 | Matsuoka ............... 156/345.33 |
| 6,827,814 | B2* | 12/2004 | Taniyama et al. ....... 156/345.12 |
| 7,935,217 | B2* | 5/2011 | Yashiki et al. .......... 156/345.17 |
| 2002/0155709 | A1 | 10/2002 | Toshima et al. |
| 2005/0026455 | A1* | 2/2005 | Hamada et al. ............. 438/782 |
| 2007/0223342 | A1* | 9/2007 | Orii et al. ................. 369/69 |
| 2008/0053487 | A1 | 3/2008 | Goto et al. |

FOREIGN PATENT DOCUMENTS

| JP | 10-4079 | 1/1998 |
| JP | 2000-21841 | 1/2000 |
| JP | 2001-170573 | 6/2001 |
| JP | 2002-134464 | 5/2002 |
| JP | 2002-299213 | 10/2002 |

* cited by examiner

*Primary Examiner* — Sylvia R MacArthur
(74) *Attorney, Agent, or Firm* — Ostrolenk Faber LLP

(57) ABSTRACT

A substrate treatment apparatus includes: a treatment chamber provided therein with a chemical solution treatment area for treating a substrate with a chemical solution and a drying treatment area provided above the chemical solution treatment area for drying the substrate; a substrate holding member vertically movably provided in the treatment chamber for holding the substrate; and a lifting mechanism vertically moving the substrate in the range between the chemical solution treatment area and the drying treatment area.

9 Claims, 8 Drawing Sheets

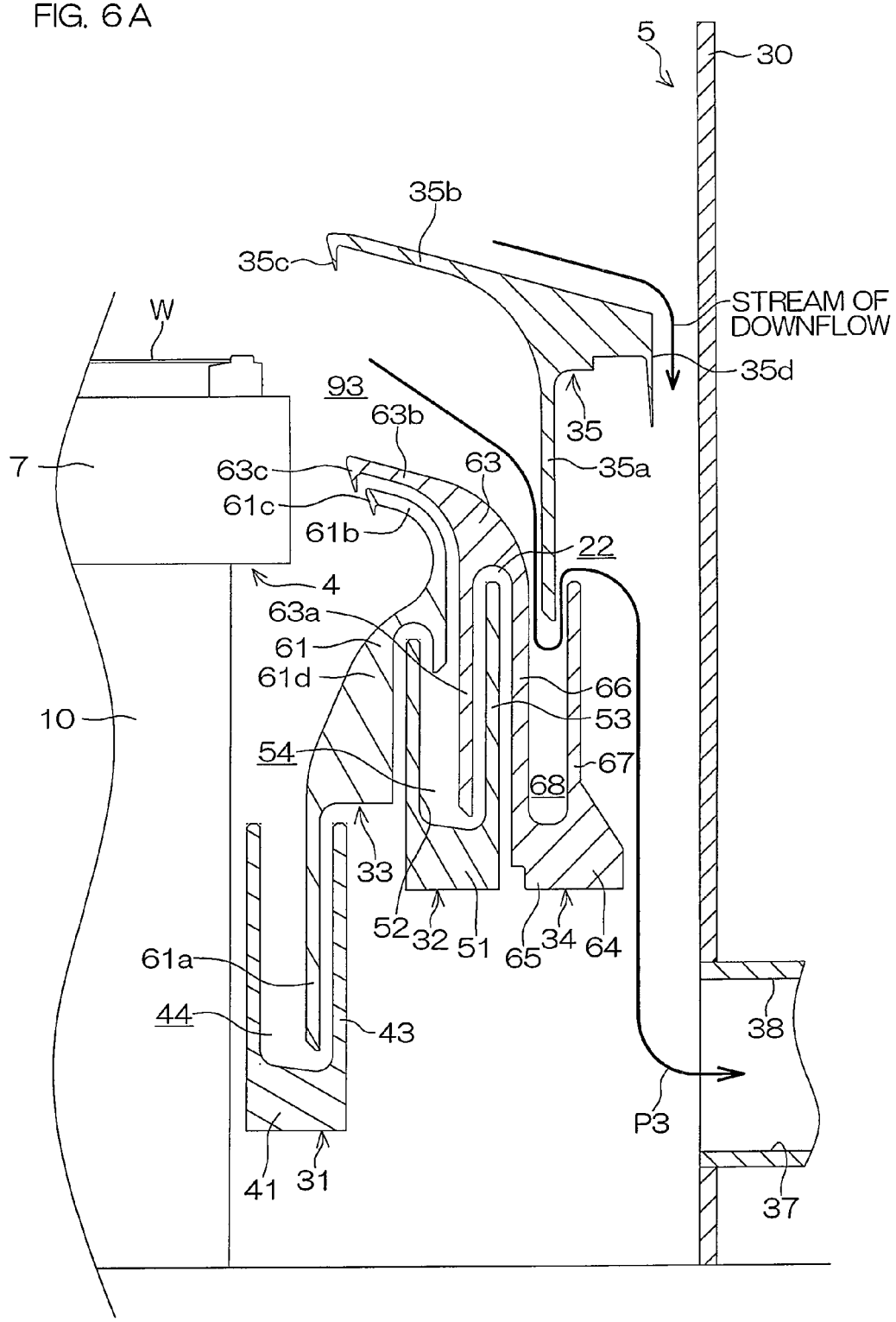

SUBSTRATE TREATMENT APPARATUS

BACKGROUND OF THE INVENTION

1. Field of the Invention

The present invention relates to a substrate treatment apparatus for treating a substrate such as a semiconductor wafer, a substrate for a liquid crystal display, a glass substrate for a plasma display, a substrate for an FED (Field Emission Display), a substrate for an optical disk, a substrate for a magnetic disk, a substrate for a magnetooptical disk or a substrate for a photomask, for example.

2. Description of Related Art

In the process of manufacturing a semiconductor device or a liquid crystal display include a resist removing treatment for removing (separating) a resist from the surface of a substrate such as a semiconductor wafer or a glass substrate for a liquid display panel with an SPM (a sulfuric acid/hydrogen peroxide mixture) and a cleaning treatment for removing a natural oxide film from the substrate with hydrofluoric acid (HF).

A single substrate treatment apparatus treating substrates one by one may be employed for such chemical solution treatments. The single substrate treatment apparatus includes a spin chuck rotating each substrate while generally horizontally holding the same, a bottomed cylindrical cup storing the spin chuck, a chemical solution nozzle for supplying chemical solutions to the substrate and a DIW nozzle for supplying DIW (deionized water) to the substrate in a treatment chamber comparted by partitions.

In each chemical solution treatment, the chemical solution is supplied from the chemical solution nozzle to the surface of the substrate rotated by the spin chuck. The chemical solution supplied onto the surface of the substrate spreads on the entire region of the surface of the substrate due to centrifugal force resulting from the rotation of the substrate. After the supply of the chemical solution is stopped, the DIW is supplied from the DIW nozzle to the surface of the substrate, to rinse the chemical solution adhering to the substrate with the DIW. After the supply of the DIW is stopped, the DIW adhering to the substrate is drained and removed by high-speed rotation of the substrate. Thus, the substrate is dried, and the serial chemical solution treatment is completed.

The spin chuck is stored in the cup, whereby the chemical solution splashing from the substrate upon supply thereto is received by the cup and prevented from splashing out of the cup. When a mist of a chemical solution flies due to an upward current and leaks out of the cup from an upper opening of the cup in the chemical solution treatment, however, the inner wall of the treatment chamber and members in the treatment chamber are contaminated with the mist of the chemical solution. When dried in the treatment chamber, the mist of the chemical solution may form particles floating in the atmosphere, to contaminate subsequently treated substrates. Therefore, a structure obtained by providing an FFU (fan filter unit) on the top face of the treatment chamber and forming an exhaust port in the bottom portion of the cup is employed (refer to Japanese Unexamined Patent Publication No. 2006-286834). According to the structure, exhaustion can be performed through the exhaust port while supplying a downflow of clean air from the FFU toward the substrate. Consequently, a downflow toward the exhaust port can be formed around the substrate, and the mist of the chemical solution can be prevented from flying due to the downflow.

The "mist" denotes vapor or droplets of a specific substance, capable of floating or splashing in the air.

When the structure is employed, however, turbulence may be formed around the substrate and a mist of a chemical solution may fly in the chemical solution treatment if air supply from the FFU and exhaustion from the exhaust port are unbalanced. It is difficult to keep the air supply and the exhaustion well-balanced, and hence the mist of the chemical solution frequently floats around the spin chuck after termination of the chemical solution treatment.

The drying treatment is performed by rotating the substrate on the spin chuck, similarly to the chemical solution treatment. Therefore, the mist of the chemical solution floating around the spin chuck may form particles, to contaminate the substrate in the process of the drying treatment.

Further, the chemical solution splashing from the substrate to be received by the cup is dried and crystallized on the wall surface of the cup, and the dried chemical solution may form particles to contaminate the substrate rotated on the spin chuck. While the cup is periodically cleaned for preventing drying of the chemical solution on the wall surface of the cup in order to prevent such contamination, it is difficult to completely remove the chemical solution. In other words, a bad influence exerted by the dried chemical solution adhering to the cup cannot be avoided so far as the drying treatment is performed in the cup (or around the cup).

SUMMARY OF THE INVENTION

Accordingly, an object of the present invention is to provide a substrate treatment apparatus capable of preventing contamination of a substrate in a drying treatment.

The substrate treatment apparatus according to the present invention includes: a treatment chamber provided therein with a chemical solution treatment area for treating a substrate with a chemical solution and a drying treatment area provided above the chemical solution treatment area for drying the substrate; a substrate holding member vertically movably provided in the treatment chamber for holding the substrate; and a lifting mechanism vertically moving the substrate in the range between the chemical solution treatment area and the drying treatment area.

According to the structure, the substrate holding member is vertically moved by the lifting mechanism in the range between the chemical solution treatment area and the drying treatment area. The substrate is treated with the chemical solution in the chemical solution treatment area, and dried in the drying treatment area. Atmospheres of the chemical solution treatment area and the drying treatment area are separated from each other, whereby the substrate can be dried in an atmosphere containing no mist of the chemical solution. Further, the drying treatment area is provided above the chemical solution treatment area, whereby neither chemical solution nor dried chemical solution falls onto the dried substrate from the chemical solution treatment area. Thus, the substrate can be prevented from contamination in the drying treatment.

Preferably, the substrate treatment apparatus further includes a chemical solution supply mechanism supplying the chemical solution to the substrate held by the substrate holding member positioned in the chemical solution treatment area, a cup provided in the chemical solution treatment area to surround the periphery of the substrate holding member positioned in the chemical solution treatment area, a substrate rotating mechanism for rotating the substrate held by the substrate holding member around a vertical axis of rotation, and a solution receiving portion provided in the drying treatment area to surround the periphery of the substrate holding member positioned in the drying treatment area for receiving a solution splashing from the substrate rotated by the substrate rotating mechanism.

According to the structure, the substrate is dried in the drying treatment area whose atmosphere is separated from that of the chemical solution treatment area provided with the cup. Therefore, the substrate can be dried with no bad influence exerted by a mist of a chemical solution floating in the cup or a dried chemical solution adhering to the cup.

In the drying treatment performed in the drying treatment area, the solution splashing from the substrate is received by the solution receiving portion. Thus, contamination with the solution splashing from the substrate can be prevented. Further, no solution from the substrate splashes into the chemical solution treatment area positioned under the drying treatment area. Thus, the chemical solution treatment area can be prevented from contamination resulting from the drying treatment performed on the substrate.

Preferably, the substrate treatment apparatus further includes a substrate transport mechanism for introducing/discharging the substrate into/from the treatment chamber, and the substrate holding member transfers/receives the substrate to/from the substrate transport mechanism on a substrate transfer position set between the chemical solution treatment area and the drying treatment area.

According to the structure, the substrate can be treated with the chemical solution in the chemical solution treatment area located under the substrate transfer position. Further, the substrate can be dried in the drying treatment area located above the substrate transfer position. The substrate transfer position is set between the chemical solution treatment area and the drying treatment area, whereby a wide space can be formed between the areas, and the atmospheres in the chemical solution treatment area and the drying treatment area can be reliably separated from each other. Thus, the substrate can be more effectively prevented from contamination in the drying treatment.

Preferably, the substrate treatment apparatus further includes a gas supply mechanism supplying a gas into the drying treatment area. According to the structure, the gas is supplied from the gas supply mechanism to the drying treatment area, whereby the drying treatment area can be kept at positive pressure. Thus, infiltration of the mist of the chemical solution from the chemical solution treatment area into the drying treatment area can be prevented or suppressed.

The gas supply mechanism may be a low-humidity gas supply mechanism supplying a low-humidity gas such as $N_2$ gas or CDA (Clean Dry Air; low-humidity air having high cleanness) Preferably, the low-humidity gas supply mechanism supplies the low-humidity gas in the drying treatment.

In this case, the substrate is dried in an atmosphere containing a large quantity of low-humidity gas. Formation of particles is suppressed as the humidity in the atmosphere is reduced, whereby the substrate can be further prevented from contamination in the drying treatment.

The supply of the low-humidity gas from the low-humidity gas supply mechanism may be stopped in a treatment (the chemical solution treatment, for example) other than the drying treatment. In this case, the usage of the relatively high-priced low-humidity gas can be reduced, whereby the running cost can be reduced by efficiently supplying the low-humidity gas to the substrate.

The gas supply mechanism may be an outside air supply mechanism supplying outside air introduced from outside the substrate treatment apparatus. The outside air supply mechanism may be an FFU (fan filter unit) having a structure obtained by stacking a fan and a filter.

The gas supply mechanism may include both of the low-humidity gas supply mechanism and the outside air supply mechanism.

Preferably, the substrate treatment apparatus further includes an exhaust mechanism exhausting the atmosphere in the drying treatment area. In this case, the drying treatment area is exhausted, so that the atmosphere around the substrate is replaced. Thus, the mist of the chemical solution can be more effectively removed from around the substrate subjected to the drying treatment.

The foregoing and other objects, features and effects of the present invention will become more apparent from the following detailed description of the embodiments with reference to the attached drawings.

BRIEF DESCRIPTION OF THE DRAWINGS

FIG. 6A is a partially fragmented schematic sectional view of the substrate treatment apparatus in a hydrofluoric acid treatment.

DETAILED DESCRIPTION OF PREFERRED EMBODIMENTS

Figure 1:
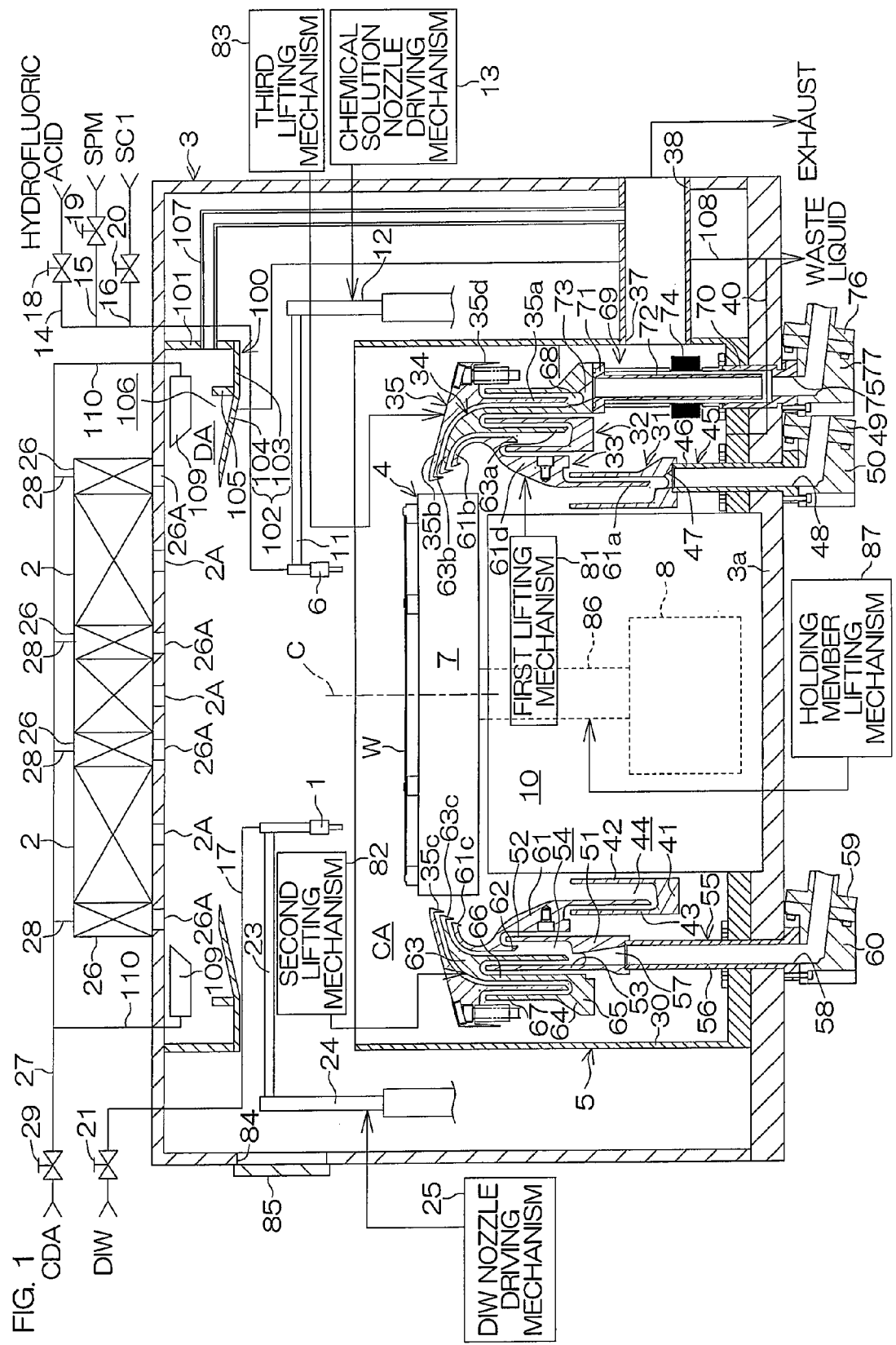
FIG. 1 is a sectional view schematically showing the structure of a substrate treatment apparatus according to an embodiment of the present invention.
Figure 2:
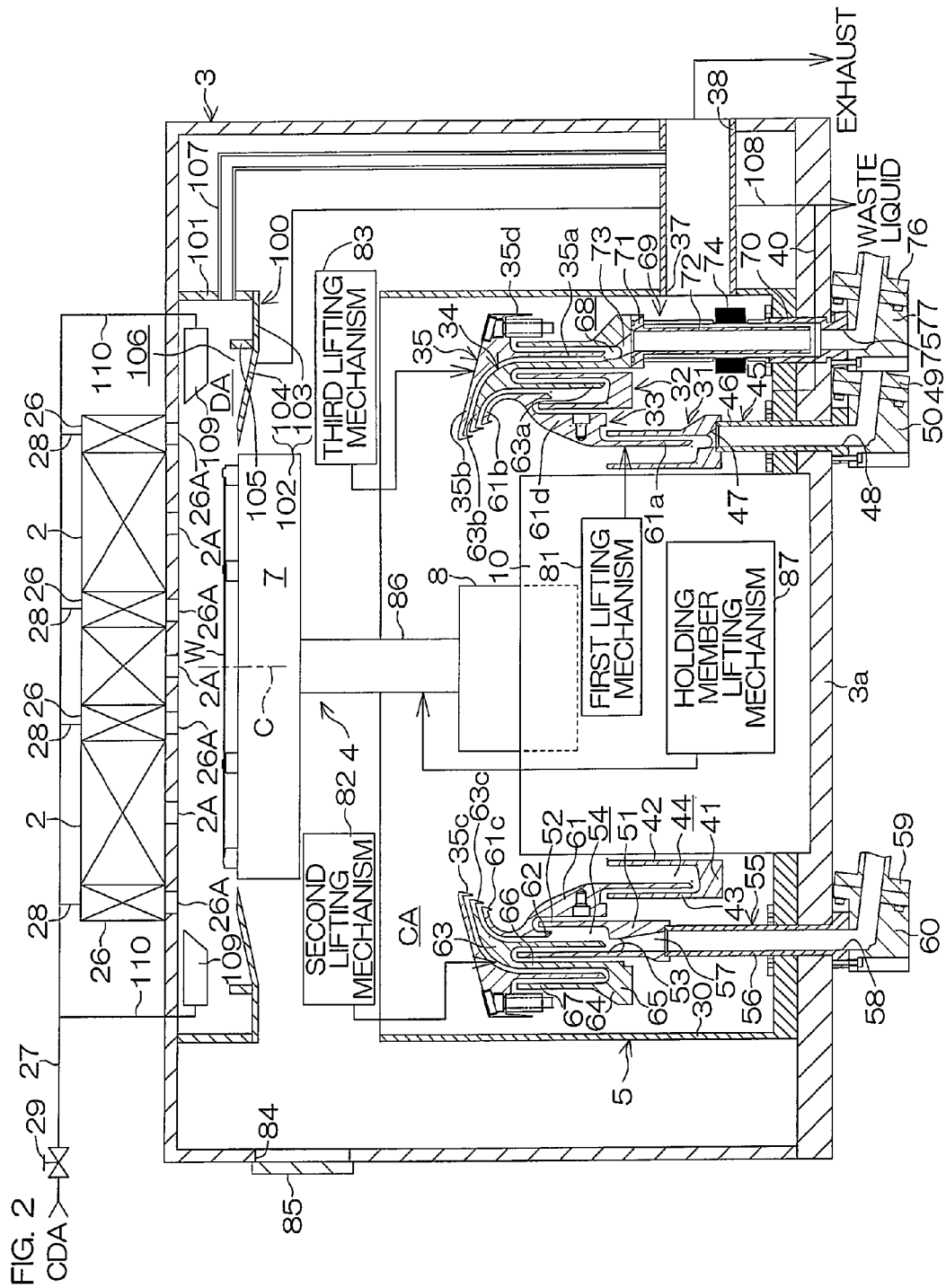
FIG. 2 is a sectional view schematically showing the structure of the substrate treatment apparatus in a drying treatment.
Figure 3:
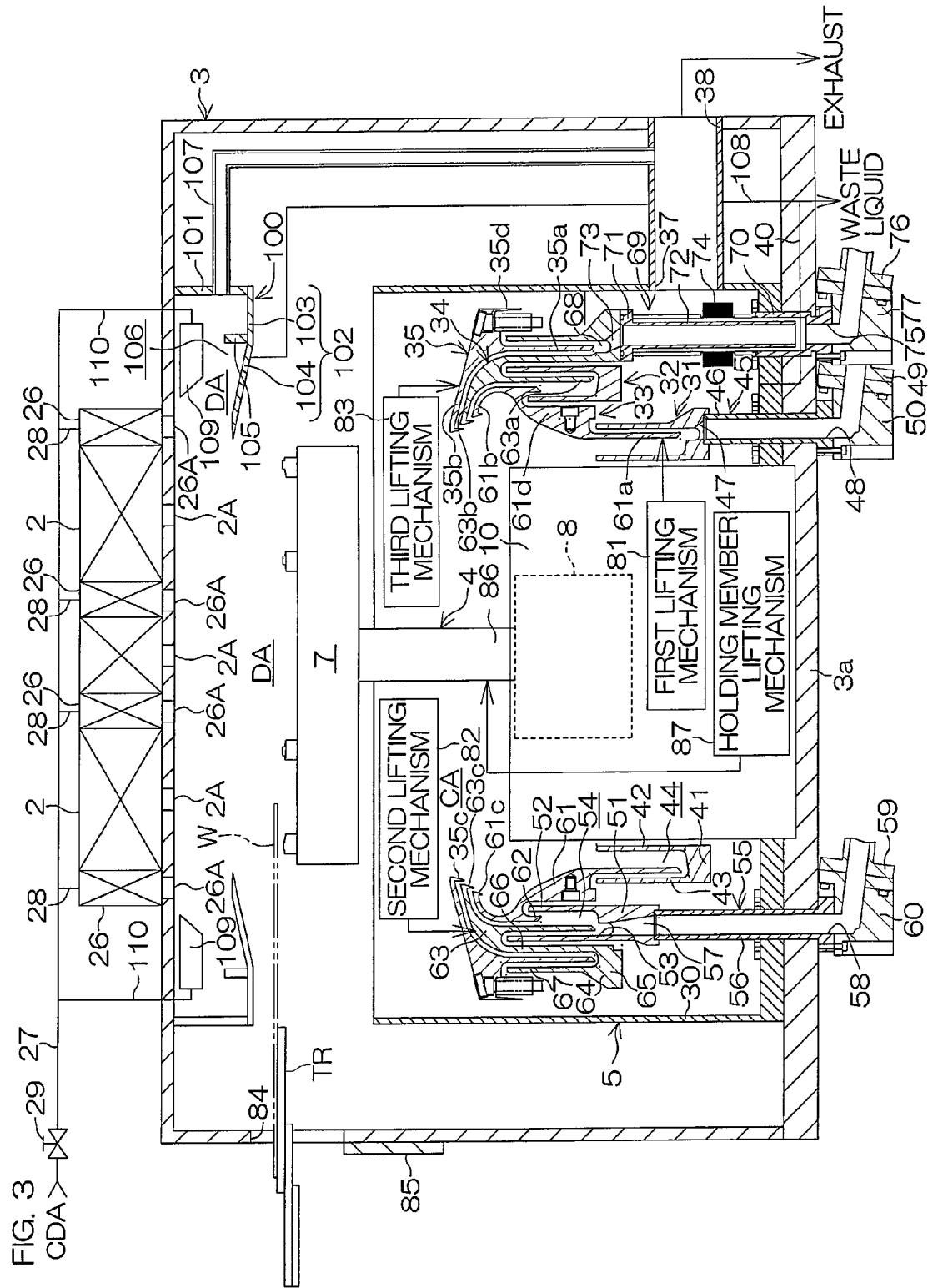
FIG. 3 is a sectional view schematically showing the structure of the substrate treatment apparatus in introduction/discharge of a substrate.

FIG. 1 is a sectional view schematically showing the structure of a substrate treatment apparatus according to an embodiment of the present invention. FIG. 2 is a sectional view schematically showing the structure of the substrate treatment apparatus in a drying treatment. FIG. 3 is a sectional view schematically showing the structure of the substrate treatment apparatus in introduction/discharge of a substrate.

The substrate treatment apparatus is a single substrate processing apparatus employed for a treatment for removing an unnecessary resist from the surface of a semiconductor wafer W (hereinafter simply referred to as "wafer") Was an example of a substrate after an ion implantation treatment of implanting an impurity into the surface of the wafer W and a dry etching treatment, for example. The substrate treatment apparatus has a treatment chamber 3 surrounded by partitions and provided with a closed space therein. The treatment chamber 3 includes a substrate holding member 4 for generally horizontally holding the wafer W and rotating the wafer W around a generally vertical axis C of rotation (see FIGS. 1 and 2), a treatment cup 5 as a cup capable of storing the substrate holding member 4, a chemical solution nozzle 6 (see FIG. 1) as a chemical solution supply mechanism for selectively supplying a plurality of chemical solutions to the surface (the upper surface) of the wafer W held by the substrate holding member 4, and a DIW nozzle 1 (see FIG. 1) supplying DIW (deionized water) as a rinsing solution to the surface (the upper surface) of the wafer W held by the substrate holding member 4. According to the embodiment, hydrofluoric acid, an SPM and an SC1 (an ammonia-hydrogen peroxide mixture) are selectively supplied from the chemical solution nozzle 6 to the wafer W as the chemical solutions.

According to the embodiment, a chemical solution treatment area CA for performing chemical solution treatments on the wafer W and a drying treatment area DA for performing a drying treatment (spin drying) on the wafer W are provided in the treatment chamber 3. The chemical solution treatment area CA is formed in a lower portion of the treatment chamber 3, while the drying treatment area DA is formed in an upper portion of the treatment chamber 3.

A plurality of (three in FIGS. 1 to 3) FFUS (gas supply mechanisms) 2 for supplying a downflow of clean air into the treatment chamber 3 are provided on the top face of the treatment chamber 3. The FFUS 2 have structures obtained by vertically stacking fans and filters, for purifying outside air introduced by the fans with the filters and supplying the purified air into the treatment chamber 3 through discharge ports 2A formed in the top face of the treatment chamber 3.

Further, a plurality of (four in FIGS. 1 to 3) CDA units (low-humidity gas supply mechanisms) 26 for supplying CDA (Clean Dry Air; low-humidity air having high cleanness) into the treatment chamber 3 are provided on the top face of the treatment chamber 3. The CDA units 26 and the FFUS 2 are alternately arranged. A branch supply pipe 28 branched from a CDA supply pipe 27 is connected to each CDA unit 26. A CDA valve 29 for opening/closing the CDA supply pipe 27 is interposed in an intermediate portion of the CDA supply pipe 27. When the CDA valve 29 is opened, the CDA unit 26 supplies the CDA into the treatment chamber 3 through a discharge port 26A formed in the top face of the treatment chamber 3.

An opening 84 for introducing and discharging the wafer W into and from the treatment chamber 3 is formed in a sidewall of the treatment chamber 3. A substrate transport robot (a substrate transport mechanism) TR (see FIG. 3) is arranged on the outer side of the treatment chamber 3, to be opposed to the opening 84. The substrate transport robot TR can place an untreated wafer W on the substrate holding member 4 located on a substrate transfer position (see FIG. 3) described later and take out a treated wafer W from the substrate holding member 4 by making a hand access the treatment chamber 3 through the opening 84. In relation to the opening 84 formed in the sidewall, a shutter 85 for opening/closing the opening 84 is provided on the outer side of the treatment chamber 3.

The substrate holding member 4 includes a generally vertically extending spin shaft 86, a spin base 7 mounted on the upper end of the spin shaft 86 in a generally horizontal attitude and a plurality of nipping members 9 arranged on the peripheral edge portion of the spin base 7. The substrate holding member 4 is rotationally driven by a motor (a substrate rotating mechanism) 8 integrally vertically movably provided on the spin shaft 86. The plurality of (e.g., six) nipping members 9 are arranged on a circumference centering on the central axis of the spin shaft 86 at generally regular angular intervals. The nipping members 9 are brought into contact with an end surface of the wafer W for nipping the wafer W with the plurality of nipping members 9, whereby the wafer W is held in a generally horizontal attitude, and the center of the wafer W is arranged on the central axis of the spin shaft 86.

The substrate treatment apparatus further includes a holding member lifting mechanism 87 as a lifting mechanism vertically moving the substrate holding member 4 between the chemical solution treatment area CA and the drying treatment area DA. A ball screw mechanism, for example, is employed as the holding member lifting mechanism 87. More specifically, the holding member lifting mechanism 87 vertically moves the wafer W held by the substrate holding member 4 between a chemical solution treatment position (the position of the wafer W shown in FIG. 1) for performing the chemical solution treatments on the wafer W and a drying treatment position (the position of the wafer W shown in FIG. 2) remarkably separated upward from the chemical solution treatment position for performing the drying treatment on the wafer W. The wafer W is transferred between the substrate holding member 4 and the substrate transport robot TR on the substrate transfer position (the position of the substrate holding member 4 shown in FIG. 3) set between the chemical solution treatment position and the drying treatment position.

The drying treatment position shown in FIG. 2 is set immediately under the discharge ports 2A of the FFUS 2 and the discharge ports 26A of the CDA units 26.

A cylindrical cover member 10 is arranged on a bottom wall 3a of the treatment chamber 3. The lower end of the cover member 10 is fixed to the bottom wall 3a of the treatment chamber 3, while the upper end thereof extends up to a portion close to the spin base 7. When the substrate holding member 4 is in the chemical solution treatment area CA and the wafer W held by the substrate holding member 4 is located on the chemical solution treatment position (the position of the wafer W shown in FIG. 1), the cover member 10 surrounds the peripheries of the motor 8 and the spin shaft 86 of the substrate holding member 4. When the substrate holding member 4 moves up from the chemical solution treatment area CA toward the drying treatment area DA, the motor 8 and the spin shaft 86 separate from the cover member 10.

The chemical solution nozzle 6 is mounted on the forward end portion of a first nozzle arm 11 generally horizontally extending above the substrate holding member 4. The first nozzle arm 11 is supported by a first arm support shaft 12 generally vertically extending on a side of the treatment cup 5. A chemical solution nozzle driving mechanism 13 including a motor (not shown) is coupled to the first arm support shaft 12. The first nozzle arm 11 can be swung above the substrate holding member 4 by inputting torque from the chemical solution nozzle driving mechanism 13 into the first arm support shaft 12 and pivoting the first arm support shaft 12. The chemical solution nozzle 6 is retracted to a retracted position on the side of the treatment cup 5 when supplying no chemical solution, and moves to a position opposed to the upper surface of the wafer W when supplying any chemical solution.

A hydrofluoric acid supply pipe 14 supplied with hydrofluoric acid from a hydrofluoric acid source, an SPM supply pipe 15 supplied with the SPM from an SPM source and an SC1 supply pipe 16 supplied with the SC1 from an SC1 source are connected to the chemical solution nozzle 6. A hydrofluoric acid valve 18 for opening/closing the hydrofluoric acid supply pipe 14 is interposed in an intermediate portion of the hydrofluoric acid supply pipe 14. An SPM valve 19 for opening/closing the SPM supply pipe 15 is interposed in an intermediate portion of the SPM supply pipe 15. An SC1 valve 20 for opening/closing the SC1 supply pipe 16 is interposed in an intermediate portion of the SC1 supply pipe 16.

When the hydrofluoric acid valve 18 is opened while the SPM valves 19 and the SC1 valve 20 are closed, the hydrofluoric acid is supplied from the hydrofluoric acid supply pipe 14 to the chemical solution nozzle 6, and discharged from the chemical solution nozzle 6 downward.

When the SPM valve 19 is opened while the hydrofluoric acid valve 18 and the SC1 valve 20 are closed, the SPM is supplied from the SPM supply pipe 15 to the chemical solution nozzle 6, and discharged from the chemical solution nozzle 6 downward.

When the SC1 valve 20 is opened while the hydrofluoric acid valve 18 and the SPM valve 19 are closed, the SC1 is supplied from the SC1 supply pipe 16 to the chemical solution nozzle 6, and discharged from the chemical solution nozzle 6 downward.

The DIW nozzle 1 is mounted on the forward end portion of a second nozzle arm 23 generally horizontally extending above the substrate holding member 4. The second nozzle arm 23 is supported by a second arm support shaft 24 generally vertically extending on a side of the treatment cup 5. A DIW nozzle driving mechanism 25 including a motor (not shown) is coupled to the second arm support shaft 24. The second nozzle arm 23 can be swung above the substrate holding member 4 by inputting torque from the DIW nozzle driving mechanism 25 into the second arm support shaft 24 and pivoting the second arm support shaft 24. The DIW nozzle 1 is retracted to a retracted position on a side of the treatment cup 5 when supplying no DIW, and moves to a position opposed to the upper surface of the wafer W when supplying the DIW.

A DIW supply pipe 17 supplied with the DIW of ordinary temperature (25° C., for example) from a DIW source is connected to the DIW nozzle 1. A DIW valve 21 for opening/closing the DIW supply pipe 17 is interposed in an intermediate portion of the DIW supply pipe 17.

The treatment cup 5 includes a bottomed cylindrical exhaust tub 30 stored in the treatment chamber 3 and first and second cup members 31 and 32 fixedly stored in the exhaust tub 30. The treatment cup 5 further includes a first guard 33, a second guard 34 and a third guard 35 stored in the exhaust tub 30 and vertically movable independently of one another. According to the embodiment, the first and second cup members 31 and 32 do not integrally move with the first to third guards 33, 34 and 35, but are fixed in the exhaust tub 30. Therefore, the weights of the members to be vertically moved can be reduced, and loads on lifting mechanisms 81, 82 and 83 for vertically moving the first to third guards 33, 34 and 35 respectively can be reduced.

An exhaust port 37 passing through the inside and outside of the sidewall of the exhaust tube 30 is formed in the sidewall. An exhaust pipe 38 exhausting the atmosphere in the exhaust tub 30 through the exhaust port 37 is connected to the exhaust port 37.

A waste liquid pipe 40 is connected to the bottom portion of the exhaust tub 30. Treatment solutions stored in the bottom portion of the exhaust tub 30 are guided to waste liquid treating equipment through the waste liquid pipe 40.

The first cup member 31, surrounding the periphery of the substrate holding member 4 (the cover member 10) positioned in the chemical solution treatment area CA, has a generally rotation-symmetrical shape with respect to the axis C of rotation of the wafer W with the substrate holding member 4. The first cup member 31 integrally includes a bottom portion 41 annular in plan view, a cylindrical inner wall portion 42 uprighted from the inner peripheral edge portion of the bottom portion 41 and a cylindrical outer wall portion 43 uprighted from the outer peripheral edge portion of the bottom portion 41. The bottom portion 41, the inner wall portion 42 and the outer wall portion 43 have U-shaped sections. The bottom portion 41, the inner wall portion 42 and the outer wall portion 43 partition a waste liquid groove 44 for collecting and disposing the treatment solutions (the SC1 and the DIW, for example) used for treating the wafer W. Waste liquid mechanisms 45 for guiding the treatment solutions collected in the waste liquid groove 44 to exhaust equipment (not shown) are connected to the lowermost part of the bottom portion of the waste liquid groove 44. A plurality of (e.g., two) such waste liquid mechanisms 45 are provided at regular intervals in relation to the peripheral direction of the waste liquid groove 4.

Each waste liquid mechanism 45 includes a fixed cylinder member 46 fixed to the lower surface of the bottom wall 3a of the treatment chamber 3 to extend upward through the bottom portion of the exhaust tub 30 and the bottom wall 3a of the treatment chamber 3 and a communication hole 47 communicatively connecting the fixed cylinder member 46 and the waste liquid groove 44 with each other. The fixed cylinder member 46 holds the first cup member 31, and a lower opening of the fixed cylinder member 46 forms a connecting port 48. A joint 50 connected to a waste liquid pipe 49 extending from a waste liquid tank (not shown) is connected to the connecting port 48. The treatment solutions (the SC1 and the DIW, for example) collected in the waste liquid groove 44 are guided to the waste liquid tank (not shown) through the communication hole 47, the fixed cylinder member 46, the joint 50 and the waste liquid pipe 49.

The second cup member 32, surrounding the periphery of the substrate holding member 4 on the outer side of the first cup member 31, has a generally rotation-symmetrical shape with respect to the axis C of rotation of the wafer W with the substrate holding member 4. The second cup member 32 integrally includes a bottom portion 51 annular in plan view, a cylindrical inner wall portion 52 uprighted from the inner peripheral edge portion of the bottom portion 51 and a cylindrical outer wall portion 53 uprighted from the outer peripheral edge portion of the bottom portion 51. The bottom portion 51, the inner wall portion 52 and the outer wall portion 53 have U-shaped sections. The bottom portion 51, the inner wall portion 52 and the outer wall portion 53 partition an inner recovery groove 54 for collecting and recovering a chemical solution (the SPM, for example) used for treating the wafer W. First recovery mechanisms 55 for recovering the chemical solution collected in the inner recovery groove 54 to recovery equipment (not shown) are connected to the lowermost part of the bottom portion of the inner recovery groove 54. A plurality of (e.g., two) such first recovery mechanisms 55 are provided at regular intervals in relation to the peripheral direction of the inner recovery groove 54.

Each first recovery mechanism 55 includes a fixed cylinder member 56 fixed to the lower surface of the bottom portion 3a of the treatment chamber 3 to extend upward through the bottom portion of the exhaust tub 30 and the bottom wall 3a of the treatment chamber 3 and a communication hole 57 communicatively connecting the fixed cylinder member 56 and the inner recovery groove 54 with each other. The fixed cylinder member 56 holds the second cup member 32, and a lower opening of the fixed cylinder member 56 forms a connecting port 58. A joint 60 connected to a first recovery pipe 59 extending from a recovery tank (not shown) is connected to the connecting port 58. The chemical solution collected in the inner recovery groove 54 is recovered in the recovery tank through the communication hole 57, the fixed cylinder member 56, the joint 60 and the first recovery pipe 59.

The first guard 33, surrounding the periphery of the substrate holding member 4, has a generally rotation-symmetrical shape with respect to the axis C of rotation of the wafer W with the substrate holding member 4. The first guard 33 includes a generally cylindrical first guide portion 61 and a cylindrical separation wall 62 coupled to the first guide portion 61.

The first guide portion 61 has a cylindrical lower end portion 61a surrounding the periphery of the substrate holding member 4, a middle stage portion 61d extending obliquely upward from the upper end of the lower end portion 61a outward in the radial direction (a direction separating from the axis C of rotation of the wafer W), an upper end portion 61b extending obliquely upward from the upper end of the middle stage portion 61d toward a central side (a direction approaching the axis C of rotation of the wafer W) while drawing a smooth arc, and a folded portion 61c formed by folding the forward end portion of the upper end portion 61b downward. The separation wall 62 is suspended downward from the outer peripheral edge portion of the middle stage portion 61d, and positioned on the inner recovery groove 54 of the second cup member 32.

The lower end portion 61a of the first guide portion 61, positioned on the waste liquid groove 44, is formed in such a length that the same is stored in the waste liquid groove 44 of the first cup member 31 while keeping an extremely small clearance between the same and the bottom portion 41 and the outer wall portion 43 when the first guard 33 most approaches the first cup member 31.

The second guard 34, surrounding the periphery of the first guard 33, has a generally rotation-symmetrical shape with respect to the axis C of rotation of the wafer W with the substrate holding member 4. The second guard 34 integrally includes a second guide portion 63 and a cup portion 64.

The second guide portion 63 has a cylindrical lower end portion 63a coaxial with the lower end portion 61a of the first guide portion 61 on the outer side of the first guide portion 61 of the first guard 33, an upper end portion 63b extending obliquely upward from the upper end of the lower end portion 63a toward the central side (the direction approaching the axis C of rotation of the wafer W) while drawing a smooth arc, and a folded portion 63c formed by folding the forward end portion of the upper end portion 63b downward. The lower end portion 63a is positioned on the inner recovery groove 54. The lower end portion 63a is stored in the inner recovery groove 54 while keeping a clearance between the same and the bottom portion 51 and the outer wall portion 53 of the second cup member 32 as well as the separation wall 62 when the second guard 34 and the second cup member 32 most approach each other. On the other hand, the upper end portion 63b is provided to vertically overlap with the upper end portion 61b of the first guide portion 61 of the first guard 33. The upper end portion 63b approaches the upper end portion 61b of the first guide portion 61 while keeping an extremely small clearance when the first guard 33 and the second guard 34 most approach each other.

The second guide portion 63 includes a folded portion 63c formed by folding the forward end of the upper end portion 63b thereof generally vertically downward. The folded portion 63c is formed to horizontally overlap with the upper end portion 61b of the first guide portion 61 when the first guard 33 and the second guard 34 most approach each other. The thickness of the upper end portion 63b of the second guide portion 63 is increased downward.

The cup portion 64 includes a bottom portion 65 annular in plan view, a cylindrical inner wall portion 66 uprighted from the inner peripheral edge portion of the bottom portion 65 and coupled to the second guide portion 63 and a cylindrical outer wall portion 67 uprighted from the outer peripheral edge portion of the bottom portion 65. The bottom portion 65, the inner wall portion 66 and the outer wall portion 67 have U-shaped sections. The bottom portion 65, the inner wall portion 66 and the outer wall portion 67 partition an outer recovery groove 68 for collecting and recovering the chemical solution (hydrofluoric acid, for example) used for treating the wafer W. The inner wall portion 66 of the cup portion 64 is coupled to the outer peripheral edge portion of the upper end portion 63b of the second guide portion 63.

Second recovery mechanisms 69 for recovering the chemical solution collected in the outer recovery groove 68 to the recovery tank (not shown) are connected to the outer recovery groove 68. A plurality of (e.g., two) such second recovery mechanisms 69 are provided at regular intervals in relation to the peripheral direction of the outer recovery groove 68, as shown in FIG. 1.

Each second recovery mechanism 69 includes a fixed cylinder member 70 fixed to the lower surface of the bottom wall 3a of the treatment chamber 3 to extend upward through the bottom portion of the exhaust tub 30 and the bottom wall 3a of the treatment chamber 3, an annular holding member 71 fixed to the bottom portion 65 of the cup portion 64 of the second guard 34, a movable cylinder member 62 having an upper end portion held by the holding member 71 and a lower end portion inserted into the fixed cylinder member 70, a communication hole 73 communicatively connecting the movable cylinder member 72 and the outer recovery groove 68 with each other, and a bellows 74 having an upper end portion fixed to the holding member 71 and a lower end portion fixed to the fixed cylinder member 70 and covering the outer periphery of the movable cylinder member 72. A lower opening of the fixed cylinder member 70 forms a connecting port 75. A joint 77 connected to a second recovery pipe 76 extending from the recovery tank is connected to the connecting port 75. The chemical solution collected in the outer recovery groove 68 is recovered in the recovery tank through the communication hole 73, the movable cylinder member 72, the fixed cylinder member 70, the joint 77 and the second recovery pipe 76.

The third guard 35, surrounding the periphery of the substrate holding member 4 on the outer side of the second guide portion 63 of the second guard 34, has a generally rotation-symmetrical shape with respect to the axis C of rotation of the wafer W with the substrate holding member 4. The third guard 35 has a cylindrical lower end portion 35a coaxial with the lower end portion 63a of the second guide portion 63, an upper end portion 35b extending obliquely upward from the upper end of the lower end portion 35a toward the central side (the direction approaching the axis C of rotation of the wafer W) while drawing a smooth arc, a folded portion 35c formed by folding the forward end portion of the upper end portion 35b generally vertically downward, and an outer end portion 35d formed to protrude from the upper end portion 35b in a direction separating from the axis C of rotation.

The lower end portion 35a, positioned on the outer recovery groove 68, is formed in such a length that the same is stored in the outer recovery groove 68 while keeping an extremely small clearance between the same and the bottom portion 65, the inner wall portion 66 and the outer wall portion 67 of the second guard 34 when the second guard 34 and the third guard 35 most approach each other.

The upper end portion 35b is provided to vertically overlap with the upper end portion 63b of the second guide portion 63 of the second guard 34, and formed to approach the upper end portion 63b of the second guide portion 63 while keeping an extremely small clearance when the second guard 34 and the third guard 35 most approach each other.

The folded portion 35c is formed to horizontally overlap with the upper end portion 63b of the second guide portion 63 when the second guard 34 and the third guard 35 most approach each other.

A clearance is formed between the outer end of the outer end portion 35d and the inner surface of the sidewall of the exhaust tub 30.

The substrate treatment apparatus further includes first lifting mechanisms (exhaust passage forming means) 81 for vertically moving the first guard 33, second lifting mechanisms (exhaust passage forming means) 82 for vertically moving the second guard 34 and third lifting mechanisms (exhaust passage forming means) 83 for vertically moving the third guard 35. Ball screw mechanisms or cylinders are employed as the lifting mechanisms 81, 82 and 83. A plurality of (e.g., three) sets of such lifting mechanisms 81, 82 and 83 are provided at regular intervals in relation to the peripheral direction of the exhaust tub 30.

A trough 100 as a solution receiving portion for receiving the treatment solution (DIW, for example) splashing from the wafer W held by the substrate holding member 4 positioned in the drying treatment area DA is mounted on the top face of the treatment chamber 3.

The trough 100 includes a cylindrical sidewall 101 annularly formed in plan view and suspended downward from the top face of the treatment chamber 3 and an annular lower wall 102 protruding from the lower end inward in the radial direction of the sidewall 101. The lower wall 102 includes a horizontal portion 103 connected to the lower end of the sidewall 101 to horizontally extend and an inclined portion 104 connected to the horizontal portion 103 and directed upward toward the inner side of in the radial direction of the sidewall 101. A cylindrical vertical plate 105 is vertically uprighted from the boundary portion between the horizontal portion 103 and the inclined portion 104 of the lower wall 102. A relatively large clearance is provided between the upper end of the vertical plate 105 and the top face of the treatment chamber 3. The vertical plate 105 and the inclined portion 104 partition a reservoir groove 106 for collecting the treatment solution splashing from the wafer W.

A branch exhaust pipe (an exhaust mechanism) 107 branched from an intermediate portion of the exhaust pipe 38 is connected to the sidewall 101 of the trough 100. The forward end of the branch exhaust pipe 107 opens in the inner surface of the sidewall 101. The exhaust pipe 38 is forcibly exhausted to exhaust the branch exhaust pipe 107, thereby exhausting the atmosphere in the trough 100 through the branch exhaust pipe 107 and the exhaust pipe 38. In the process of flowing through the trough 100, a mist of a treatment solution (a mist of the DIW, for example) contained in the atmosphere adheres to and is captured by the vertical plate 105. Therefore, the atmosphere containing the mist of the treatment solution can be gas-liquid separated. The treatment solution captured by the vertical plate 105 is collected in the reservoir groove 106, and thereafter guided to the waste liquid treating equipment through a waste liquid pipe 108.

The trough 100 is provided therein with CDA nozzles 109 (low-humidity gas supply mechanisms) for supplying the CDA into the trough 100 (the drying treatment area DA).

A plurality of CDA nozzles 109 (FIG. 2 shows two CDA nozzles 109) are arranged on positions immediately above the drying treatment position for the wafer W (the position of the wafer W shown in FIG. 2) at intervals in the peripheral direction, while directing discharge ports thereof inward in the radial direction of the trough 100. The forward end of each CDA nozzle 109 is positioned outward in the radial direction beyond the forward end of the inclined portion 104 of the lower wall 102. A branch supply pipe 110 branched from the CDA supply pipe 27 is connected to each CDA nozzle 109. When the CDA valve 29 is opened, the CDA is discharged from the CDA nozzle 109 inward in the radial direction.

Figure 4:
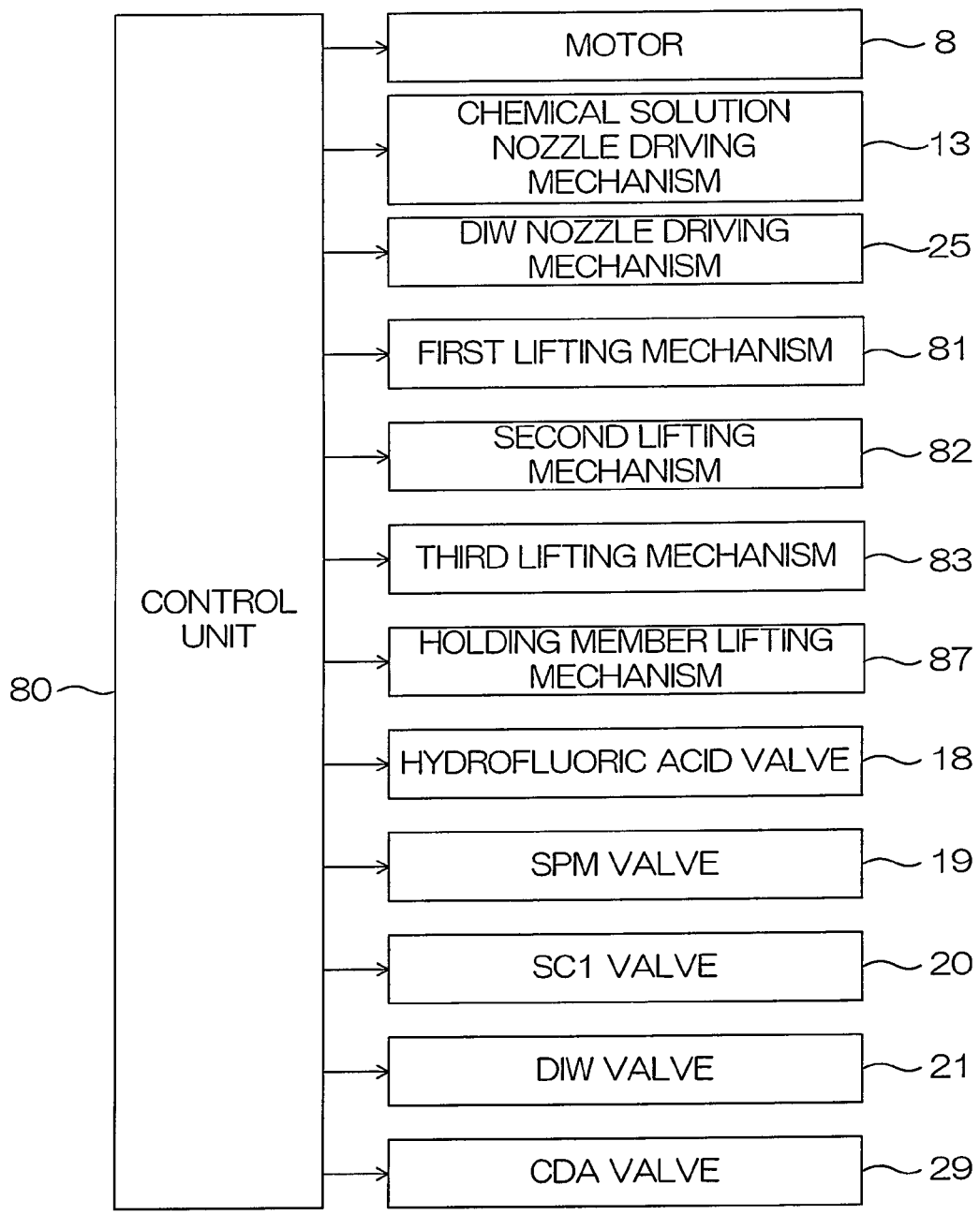
FIG. 4 is a block diagram showing the electrical structure of the substrate treatment apparatus.

FIG. 4 is a block diagram showing the electrical structure of the substrate treatment apparatus shown in FIG. 1.

The substrate treatment apparatus includes a control unit 80 including a microcomputer. The motor 8, the chemical solution nozzle driving mechanism 13, the DIW nozzle driving mechanism 25, the first lifting mechanisms 81, the second lifting mechanisms 82, the third lifting mechanisms 83, the holding member lifting mechanism 87, the hydrofluoric acid valve 18, the SPM valve 19, the SC1 valve 20, the DIW valve 21 and the CDA valve 29 are connected to the control unit 80 as objects to be controlled.

Figure 5:
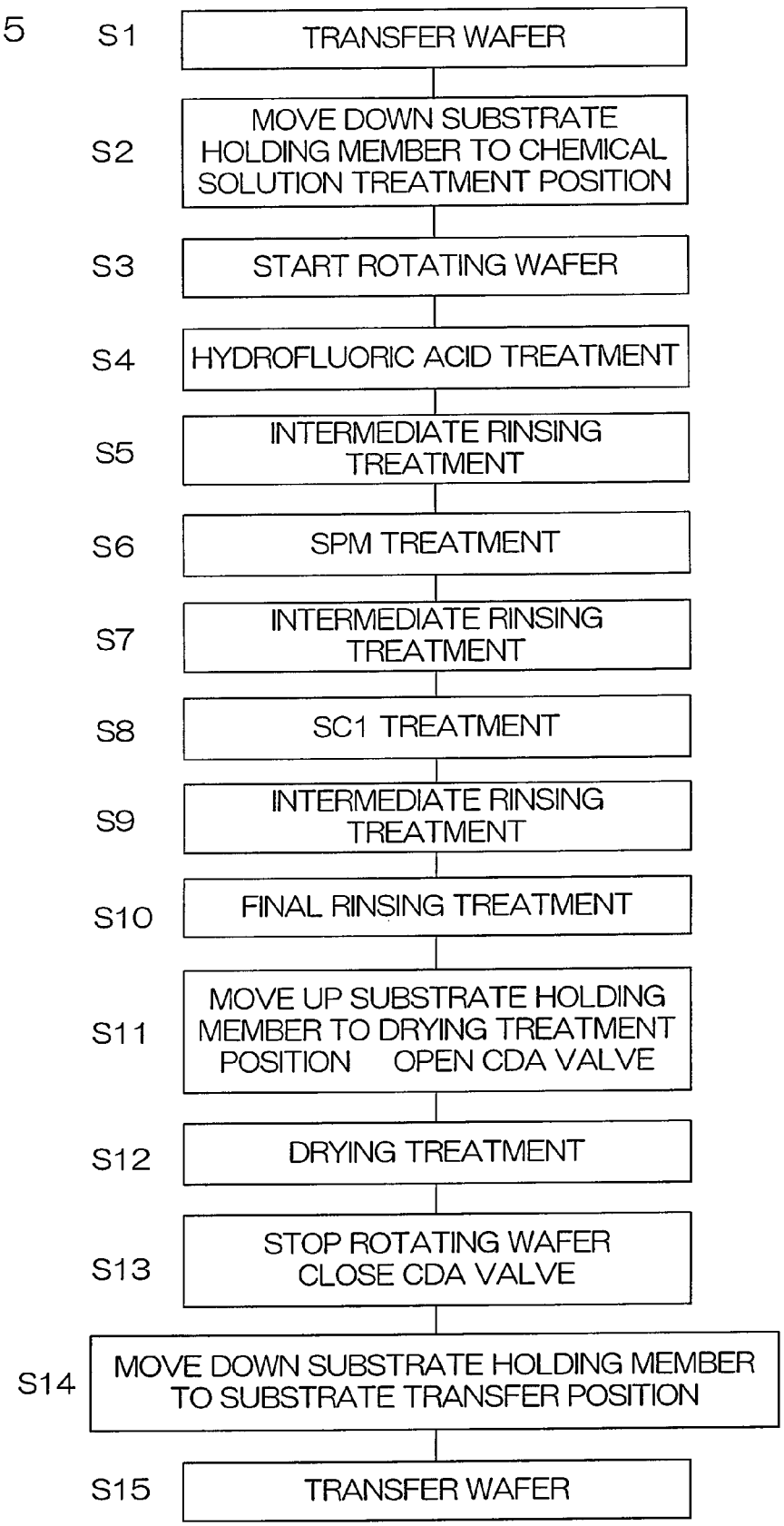
FIG. 5 is a flow chart for illustrating examples of treatments performed in the substrate treatment apparatus.
Figure 6B:
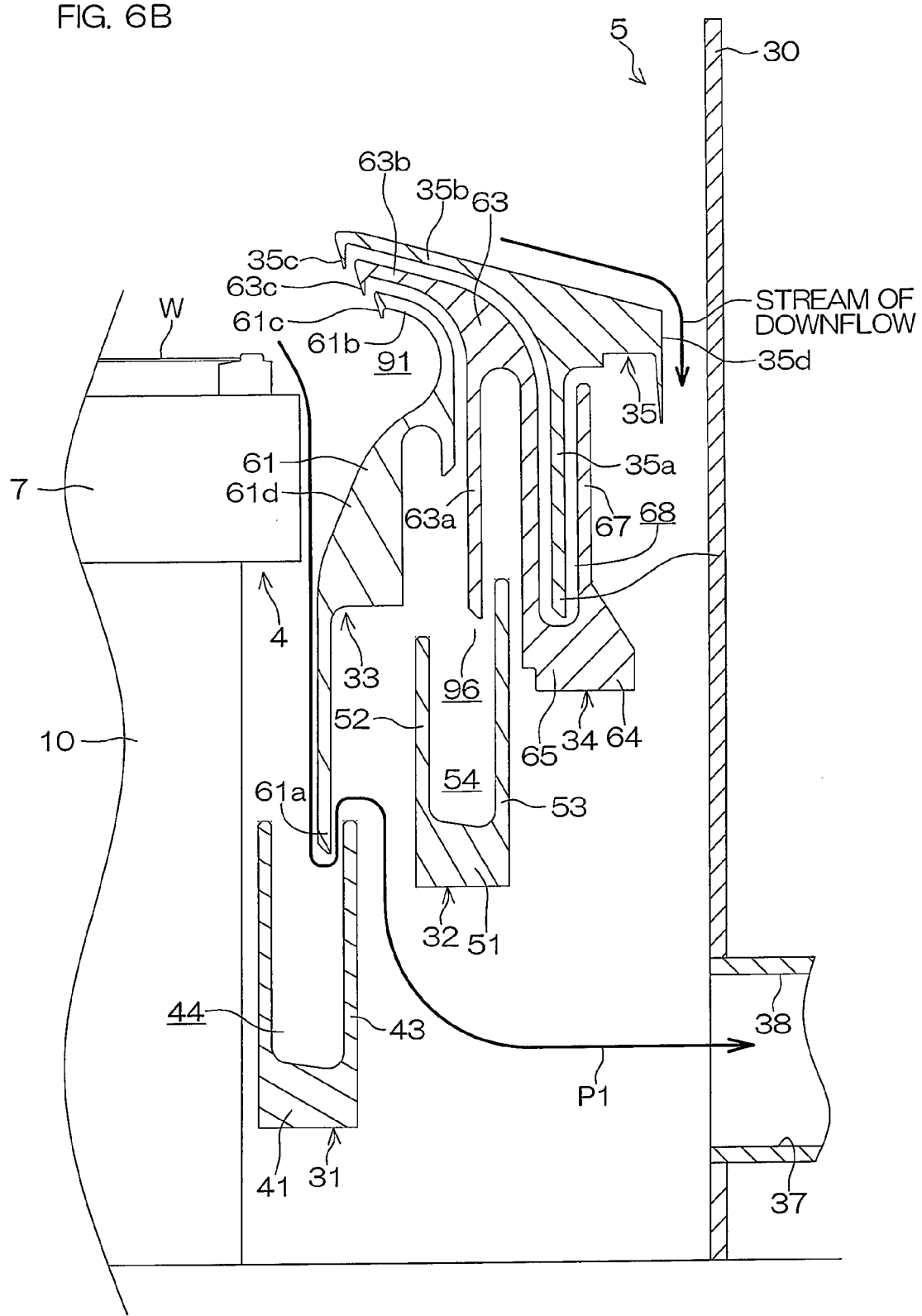
FIG. 6B is a partially fragmented schematic sectional view of the substrate treatment apparatus in an SC1 treatment, an intermediate rinsing treatment and a final rinsing treatment.
Figure 6C:
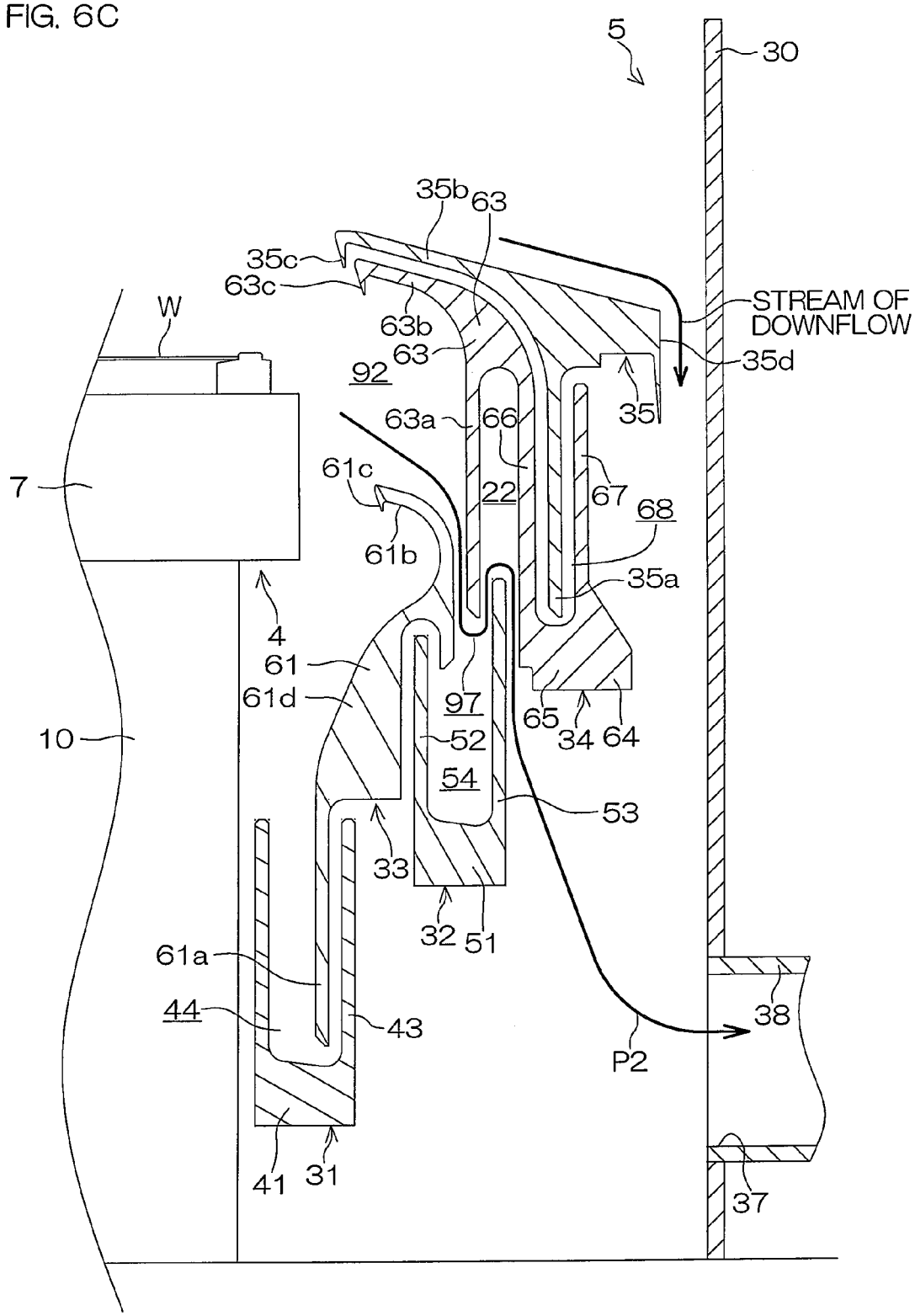
FIG. 6C is a partially fragmented schematic sectional view of the substrate treatment apparatus in an SPM treatment.

FIG. 5 is a flow chart for illustrating examples of treatments performed in the substrate treatment apparatus shown in FIG. 1. FIGS. 6A to 6C are partially fragmented schematic sectional views of the substrate treatment apparatus in the process of treating the wafer W.

While a serial resist removing treatment is performed on the wafer W, the exhaust pipe 38 is forcibly exhausted by the exhaust equipment (not shown). Further, the FFUS 2 supply clean air into the treatment chamber 3. Therefore, a downflow of the clean air flowing downward from above is formed in the treatment chamber 3. The downflow of the clean air is introduced into the exhaust tub 30 through a clearance between the substrate holding member 4 and the inner edge portion of the treatment cup 5 (the upper end portion 35b of the third guard 35), and guided to a side portion of the wafer W held by the substrate holding member 4. The downflow of the clean air is partially introduced into the exhaust tub 30 through a clearance between the third guard 35 and the sidewall of the exhaust tub 30.

The wafer W introduced into the treatment chamber 3 is not subjected to a treatment for ashing a resist, but a resist film is present on the surface thereof. When the wafer W is introduced, the substrate holding member 4 is located on the substrate transfer position (see FIG. 3).

At the timing for introducing the wafer W, the wafer W subjected to the ion implantation is transferred from the substrate transport robot TR to the substrate holding member 4 located on the substrate transfer position while the surface thereof is directed upward, and held by the substrate holding member 4 (step S1). After the wafer W is transferred to the substrate holding member 4, the control unit 80 drives the holding member lifting mechanism 87 to move down the substrate holding member 4 toward the chemical solution treatment area CA (step s2).

When the wafer W held by the substrate holding member 4 is moved down to the chemical solution treatment position (see FIG. 1), the control unit 80 controls the motor 8 to start rotating the wafer W with the substrate holding member 4 (rotating the spin base 7) (step S3). Further, the control unit 80 controls the third lifting mechanisms 83 to move only the third guard 35 to an upper position (the uppermost position), so that the upper end portion 35b of the third guard 35 is arranged upward beyond the wafer W held by the substrate holding member 4. Thus, a second recovery port 93 opposed to the peripheral edge portion of the wafer W is formed between the upper end portion 63b of the second guide portion 63 and the upper end portion 35b of the third guard 35 (see FIG. 6A). Further, the chemical solution nozzle driving mechanism 13 is controlled to swing the first nozzle arm 11, and the chemical solution nozzle 6 is moved to a position above the wafer W.

When the rotational speed of the wafer W reaches a prescribed rotational frequency (1000 rpm, for example), the control unit 80 opens the hydrofluoric acid valve 18, and hydrofluoric acid is discharged from the chemical solution nozzle 6 toward the surface of the rotated wafer W (S4: a hydrofluoric acid treatment).

In the hydrofluoric acid treatment, the control unit 80 controls the chemical solution nozzle driving mechanism 13, to swing the first nozzle arm 11 in a prescribed angular range. Thus, a supply position on the surface of the wafer W to which the hydrofluoric acid from the chemical solution nozzle 6 is guided reciprocates in the range reaching the peripheral edge portion of the wafer W from the rotation center thereof while drawing an arcuate locus intersecting with the rotational direction of the wafer W. The hydrofluoric acid supplied to the surface of the wafer W spreads on the overall region of the surface of the wafer W. Thus, the hydrofluoric acid is uniformly supplied to the entire region of the surface of the wafer W. A natural oxide film or the like formed on the surface of the wafer W can be removed due to the chemical action of the hydrofluoric acid supplied from the chemical solution nozzle 6 to the surface of the wafer W. When the hydrofluoric acid is supplied to the surface of the wafer W, a mist of the hydrofluoric acid is formed. The hydrofluoric acid supplied to the surface of the wafer W splashes sidewise from the peripheral edge portion of the wafer W.

The hydrofluoric acid drained from the peripheral edge portion of the wafer W to splash sidewise is captured by the second recovery port 93, flows down along the inner surface of the third guard 35, is collected in the outer recovery groove 68, and recovered in the recovery tank from the outer recovery groove 68 through the second recovery mechanism 69.

At this time, the first guard 33 and the second guard 34 approach each other while keeping an extremely small clearance between the upper end portion 61b of the first guard portion 61 and the upper end portion 63b of the second guide portion 63 while the folded portion 63c of the second guide portion 63 horizontally overlaps with the upper end portion 61b of the first guide portion 61, whereby the hydrofluoric acid is prevented from infiltrating into the space between the first guide portion 61 and the second guide portion 63.

When the second recovery port 93 is formed between the upper end portion 63b of the second guide portion 63 and the upper end portion 35b of the third guard 35, a third exhaust passage P3 reaching the exhaust port 37 from the second recovery port 93 through the space between the upper end portion 63b of the second guide portion 63 and the upper end portion 35b of the third guard 35, the space between the lower end portion 35a of the third guard 35 and the outer recovery groove 68 and the exhaust tub 30 is formed in the exhaust tub 30. The depth of the lower end portion 35a of the third guard 35 entering the outer recovery groove 68 is small, and hence the third exhaust passage P3 has relatively small pressure loss, and the downflow of the clean air introduced into the treatment cup 5 from the space between the substrate holding member 4 and the inner edge portion of the treatment cup 5 (the upper end portion 35b of the third guard 35) exclusively circulates through the third exhaust passage P3, and is guided to the exhaust port 37 due to the forcible exhaustion of the exhaust pipe 38. Thus, a current flowing into the second recovery port 93 is formed from the periphery of the wafer W held by the substrate holding member 4. The atmosphere containing the mist of the hydrofluoric acid around the wafer W is exhausted through the second recovery port 93 opposed to the peripheral edge portion of the wafer W, whereby the mist of the hydrofluoric acid can be efficiently eliminated from the periphery of the wafer W.

In the hydrofluoric acid treatment, the downflow of the clean air from the FFUS 2 is supplied to the drying treatment area DA, and fills up the drying treatment area DA. Thus, the drying treatment area DA is kept at positive pressure. Even if the mist of the hydrofluoric acid leaks from the treatment cup 5 into the chemical solution treatment area CA, therefore, the mist of the hydrofluoric acid can be prevented from infiltrating into the drying treatment area DA.

When a prescribed hydrofluoric acid treatment time elapses from the start of the supply of the hydrofluoric acid to the wafer W, the control unit 80 closes the hydrofluoric acid valve 18, to stop supplying the hydrofluoric acid from the chemical solution nozzle 6. Further, the control unit 80 drives the chemical solution nozzle driving mechanism 13 to stop swinging the first nozzle arm 11, and the chemical solution nozzle 6 is returned to the retracted position on the side of the treatment cup 5. In addition, the DIW nozzle driving mechanism 25 is controlled to swing the second nozzle arm 23, and the DIW nozzle 1 is moved to a position above the wafer W.

The control unit 80 further drives the first lifting mechanisms 81 and the second lifting mechanisms 82 to move the first guard 33 and the second guard 34 to upper positions, so that the upper end portions 61b, 63b and 35b of the first guide portion 61, the second guide portion 63 and the third guard 35 are arranged upward beyond the wafer W located on the chemical solution treatment position (the position shown in FIG. 1). Thus, a waste liquid port 91 opposed to the peripheral edge portion of the wafer W is formed between the upper end portion 61b and the lower end portion 61a of the first guide portion 61 (see FIG. 6B).

After the waste liquid port 91 is formed to be opposed to the peripheral edge portion of the wafer W, the control unit 80 opens the DIW valve 21 while continuously rotating the wafer W. Thus, the DIW is discharged from the DIW nozzle 1 toward the central portion of the surface of the rotated wafer W (S5: an intermediate rinsing treatment). When the DIW is discharged from the DIW nozzle 1, a mist of the DIW is formed. In the intermediate rinsing treatment, the DIW supplied onto the surface of the wafer W spreads on the entire region of the surface of the wafer W, to rinse the hydrofluoric acid adhering to the surface of the wafer W. The DIW containing the hydrofluoric acid is drained due to the rotation of the wafer W, and splashes sidewise from the peripheral edge portion thereof. The DIW (the DIW containing the hydrofluoric acid) drained from the peripheral edge portion of the wafer W to splash sidewise is captured by the inner surface of the first guide portion 61 of the first guard 33. The DIW flows down along the inner surface of the first guard 33, is collected in the waste liquid groove 44, and guided to the waste liquid treating equipment from the waste liquid groove 44 through the waste liquid mechanism 45.

At this time, the first guard 33, the second guard 34 and the third guard 35 approach one another while keeping extremely small clearances between the upper end portions 61b, 63b, 35b and 36b, the folded portion 35c of the third guard 35 horizontally overlaps with the upper end portion 63b of the second guide portion 63 and the folded portion 63c of the second guide portion 63 horizontally overlaps with the upper end portion 61b of the first guide portion 61, whereby the DIW is prevented from infiltrating into the space between the first guide portion 61 and the second guide portion 63 and the space between the second guide portion 63 and the third guard 35.

When the waste liquid port 91 is formed between the upper end portion 61b and the lower end portion 61a of the first guide portion 61, a first exhaust passage P1 reaching the exhaust port 37 from the waste liquid port 91 through the space between the lower end portion 61a of the first guide portion 61 and the waste liquid groove 44 is formed in the exhaust tub 30. The depth of the lower end portion 61a of the first guide portion 61 entering the waste liquid groove 44 is small, and hence the first exhaust passage P1 has relatively small pressure loss. When the exhaust pipe 38 is forcibly exhausted, therefore, the downflow of the clean air introduced into the treatment cup 5 from the space between the substrate holding member 4 and the inner edge portion of the treatment cup 5 (the upper end portion 35b of the third guard 35)

exclusively flows through the first exhaust passage P1, and is guided to the exhaust port 37. Thus, a current flowing into the waste liquid port 91 is formed from the periphery of the wafer W held by the substrate holding member 4. While the mist of the hydrofluoric acid may remain in the periphery of the wafer W in the intermediate rinsing treatment, the atmosphere containing the mists of the DIW and the hydrofluoric acid is exhausted to the exhaust port 37 from the waste liquid port 91 through the first exhaust passage P1. Therefore, the atmosphere containing the mist of the hydrofluoric acid can be efficiently eliminated from the periphery of the wafer W.

When a prescribed intermediate rinsing time elapses from the start of the supply of the DIW to the wafer W, the control unit 80 closes the DIW valve 21, to stop supplying the DIW from the DIW nozzle 1. Further, the control unit 80 drives the DIW nozzle driving mechanism 25, to return the DIW nozzle 1 to the retracted position on the side of the treatment cup 5. In addition, the chemical solution nozzle driving mechanism 13 is controlled to swing the first nozzle arm 11, and the chemical solution nozzle 6 is moved to the position above the wafer W. The control unit 80 further drives the first lifting mechanisms 81 to move down only the first guard 33 to a lower position, so that the upper end portion 61b of the first guide portion 61 of the first guard 33 is arranged downward beyond the wafer W held by the substrate holding member 4. Thus, a first recovery port 92 opposed to the peripheral edge portion of the wafer W is formed between the upper end portion 61b of the first guide portion 61 and the upper end portion 63b of the second guide portion 63 (see FIG. 6C).

After the first recovery port 92 is formed to be opposed to the peripheral edge portion of the wafer W, the control unit 80 opens the SPM valve 19 while continuously rotating the wafer W. Thus, the SPM is discharged from the chemical solution nozzle 6 toward the surface of the rotated wafer W (S6: an SPM treatment).

In the SPM treatment, the control unit 80 controls the chemical solution nozzle driving mechanism 13, to swing the first nozzle arm 11 in the prescribed angular range. Thus, the supply position on the surface of the wafer W to which the SPM from the chemical solution nozzle 6 is guided reciprocates in the range reaching the peripheral edge portion of the wafer W from the rotation center thereof while drawing an arcuate locus intersecting with the rotational direction of the wafer W. Further, the SPM supplied to the surface of the wafer W spreads on the entire region of the surface of the wafer W. Thus, the SPM is uniformly supplied to the entire region of the surface of the wafer W. When the SPM is supplied to the surface of the wafer W, strong oxidizing power of peroxomonosulfuric acid contained in the SPM acts on the resist, to remove the resist from the surface of the wafer W. When the SPM is supplied to the surface of the wafer W, a mist of the SPM is formed. The SPM supplied to the surface of the wafer W splashes sidewise from the peripheral edge portion of the wafer W.

The SPM drained from the peripheral edge portion of the wafer W to splash sidewise is captured in the first recovery port 92. The SPM flows down along the inner surface of the first guide portion 61, is collected in the inner recovery groove 54, and recovered in the recovery tank from the inner recovery groove 54 through the first recovery mechanism 55.

At this time, the second guard 34 and the third guard 35 approach each other while keeping an extremely small clearance between the upper end portions 63b and 35b thereof and the folded portion 35c of the third guard 35 horizontally overlaps with the upper end portion 63b of the second guide portion 63, whereby the SPM is prevented from infiltrating into the space between the second guide portion 63 and the third guard 35.

When the first recovery port 92 is formed between the upper end portion 61b of the first guide portion 61 and the upper end portion 63b of the second guide portion 63, a second exhaust passage P2 reaching the exhaust port 37 from the first recovery port 92 through the space between the upper end portion 61b of the first guide portion 61 and the upper end portion 63b of the second guide portion 63, the space between the lower end portion 63a of the second guide portion 63 and the inner recovery groove 54 and the exhaust tub 30 is formed in the exhaust tub 30. The depth of the lower end portion 63a of the second guide portion 63 entering the inner recovery groove 54 is small, and hence the second exhaust passage P2 has relatively small pressure loss. When the exhaust pipe 38 is forcibly exhausted, therefore, the downflow of the clean air introduced into the treatment cup 5 from the space between the substrate holding member 4 and the inner edge portion of the treatment cup 5 (the upper end portion 35b of the third guard 35) exclusively flows through the second exhaust passage P2, and is guided to the exhaust port 37. Thus, a current flowing into the first recovery port 92 is formed from the periphery of the wafer W held by the substrate holding member 4. The atmosphere containing the mist of the SPM around the wafer W is exhausted through the first recovery port 92 opposed to the peripheral edge portion of the wafer W, whereby the mist of the SPM can be efficiently eliminated from the periphery of the wafer W.

In the SPM treatment, the downflow of the clean air from the FFUS 2 is supplied to the drying treatment area DA, and fills up the drying treatment area DA. Thus, the drying treatment area DA is kept at positive pressure. Even if the mist of the SPM leaks from the treatment cup 5 into the chemical solution treatment area CA, therefore, the mist of the SPM can be prevented from infiltrating into the drying treatment area DA.

When a prescribed SPM treatment time elapses from the start of the supply of the SPM to the wafer W, the control unit 80 closes the SPM valve 19, to stop supplying the SPM from the chemical solution nozzle 6. Further, the control unit 80 drives the chemical solution nozzle driving mechanism 11 to stop swinging the first nozzle arm 11, and the chemical solution nozzle 6 is returned to the retracted position on the side of the treatment cup 5. In addition, the control unit 80 drives the DIW nozzle driving mechanism 25 to swing the second nozzle arm 23, and the DIW nozzle 1 is moved to the position above the wafer W. The control unit 80 further drives the first lifting mechanisms 81 to move up the first guard 33 to the upper position, and forms the waste liquid port 91 to be opposed to the peripheral edge portion of the wafer W (see FIG. 6B).

After the waste liquid port 91 is formed to be opposed to the peripheral edge portion of the wafer W, the control unit 80 opens the DIW valve 21 while continuously rotating the wafer W. Thus, the DIW is discharged from the DIW nozzle 1 toward the central portion of the surface of the rotated wafer W (S7: an intermediate rinsing treatment). In the intermediate rinsing treatment, the SPM adhering to the surface of the wafer W is washed out with the DIW supplied onto the surface of the wafer W. The DIW flowing toward the peripheral edge portion of the wafer W splashes sidewise from the peripheral edge portion of the wafer W, is captured in the waste liquid port 91, collected in the waste liquid groove 44, and guided to the waste liquid treating equipment from the waste liquid groove 44 through the waste liquid mechanism 45.

While the mist of the SPM may remain in the periphery of the wafer W in the intermediate rinsing treatment, the atmosphere containing the mists of the DIW and the SPM is exhausted from the waste liquid port 91 to the exhaust port 37 through the first exhaust passage P1.

When a prescribed intermediate rinsing time elapses from the start of the supply of the DIW to the wafer W, the control unit 80 closes the DIW valve 21, to stop supplying the DIW from the DIW nozzle 1. Further, the control unit 80 drives the DIW nozzle driving mechanism 25, to return the DIW nozzle 1 to the retracted position on the side of the treatment cup 5. In addition, the control unit 80 drives the chemical solution nozzle driving mechanism 13, to move the chemical solution nozzle 6 to the position above the wafer W. The control unit 80 further opens the SC1 valve 20, and the SC1 is discharged from the chemical solution nozzle 6 toward the surface of the wafer W (S8: an SC1 treatment).

In the SC1 treatment, the control unit 80 controls the chemical solution nozzle driving mechanism 13, to swing the first nozzle arm 11 in the prescribed angular range. Thus, the supply position on the surface of the wafer W to which the SC1 from the chemical solution nozzle 6 is guided reciprocates in the range reaching the peripheral edge portion of the wafer W from the rotation center thereof while drawing an arcuate locus intersecting with the rotational direction of the wafer W. The SC1 supplied to the surface of the wafer W spreads on the entire region of the surface of the wafer W. Thus, the SC1 is uniformly supplied to the entire region of the surface of the wafer W. When the SC1 is supplied from the chemical solution nozzle 6 to the surface of the wafer W, foreign matter such as a residue of the resist and particles adhering to the surface of the wafer W can be removed due to the chemical action of the SC1. When the SC1 is supplied to the surface of the wafer W, a mist of the SC1 is formed. The SC1 supplied to the surface of the wafer W splashes sidewise from the peripheral edge portion of the wafer W.

The SC1 splashing from the peripheral edge portion of the wafer W is captured in the waste liquid port 91, collected in the waste liquid groove 44, and guided to the waste liquid treating equipment from the waste liquid groove 44 through the waste liquid mechanism 45.

The atmosphere containing the SC1 around the wafer W is exhausted through the waste liquid port 91 opposed to the peripheral edge portion of the wafer W. Therefore, the mist of the SC1 can be efficiently eliminated from the periphery of the wafer W.

In the SC1 treatment, the downflow of the clean air from the FFUS 2 is supplied to the drying treatment area DA, and fills up the drying treatment area DA. Thus, the drying treatment area DA is kept at positive pressure. Even if the mist of the SC1 leaks from the treatment cup 5 into the chemical solution treatment area CA, therefore, the mist of the SC1 can be prevented from infiltrating into the drying treatment area DA.

When a prescribed SC1 treatment time elapses from the start of the supply of the SC1 to the wafer W, the control unit 80 closes the SC1 valve 20, to stop supplying the SC1 from the chemical solution nozzle 6. Further, the control unit 80 drives the chemical solution nozzle driving mechanism 13 to stop swinging the first nozzle arm 11, and the chemical solution nozzle 6 is returned to the retracted position on the side of the treatment cup 5. In addition, the control unit 80 controls the DIW nozzle driving mechanism 25 to swing the second nozzle arm 23, and the DIW nozzle 1 is moved to the position above the wafer W.

The control unit 80 further opens the DIW valve 21 while continuously rotating the wafer W. Thus, the DIW is discharged from the DIW nozzle 1 toward the central portion of the surface of the rotated wafer W (S9: an intermediate rinsing treatment). In the intermediate rinsing treatment, the SC1 adhering to the surface of the wafer W is washed out with the DIW supplied to the surface of the wafer W. The DIW flowing toward the peripheral edge portion of the wafer W splashes sidewise from the peripheral edge portion of the wafer W, is captured in the waste liquid port 91, collected in the waste liquid groove 44, and guided to the waste liquid treating equipment from the waste liquid groove 44 through the waste liquid mechanism 45.

While the mist of the SC1 may remain in the periphery of the wafer W in the intermediate rinsing treatment, the atmosphere containing the mists of the DIW and the SC1 is exhausted to the exhaust port 37 from the waste liquid port 91 through the first exhaust passage P1.

When a prescribed intermediate rinsing time elapses from the start of the supply of the DIW to the wafer W, the control unit 80 drives the first to third lifting mechanisms 81, 82 and 83 to move down the first to third guards 33, 34 and 35 to lower positions, so that the upper end portion 61*b* of the first guide portion 61, the upper end portion 63*b* of the second guide portion 63 and the upper end portion 35*b* of the third guard 35 are arranged under the wafer W held by the substrate holding member 4 (S10: a final rinsing treatment, see FIG. 1).

At this time, the first guard 33, the second guard 34 and the third guard 35 are synchronously moved up to the upper positions while keeping extremely small clearances between the upper end portion 61*b* of the first guide portion 61 and the upper end portion 63*b* of the second guide portion 63 and between the upper end portion 63*b* of the second guide portion 63 and the upper end portion 35*b* of the third guard 35 respectively (keeping relative positional relations between the first guard 33, the second guard 34 and the third guard 35). Thus, the DIW splashing from the wafer W can be prevented from infiltrating into the space between the first guide portion 61 and the second guide portion 63 and the space between the second guide portion 63 and the third guard 35 even if the substrate holding member 4 continuously rotates the wafer W and the DIW is continuously supplied.

In the final rinsing treatment, the DIW supplied onto the surface of the wafer W spreads on the entire region of the surface of the wafer W, to wash out the chemical solution (the SC1, for example) adhering to the surface of the wafer W. The DIW is drained due to the rotation of the wafer W, and splashes sidewise from the peripheral edge portion thereof. The DIW drained from the peripheral edge portion of the wafer W to splash sidewise is received by the upper surface of the upper end portion 35*b* of the third guard 35 and the inner surface of the sidewall of the exhaust tub 30, collected in the bottom portion of the exhaust tub 30 along the inner surface of the sidewall, and guided to the waste liquid treating equipment from the bottom portion of the exhaust tub 30 through the waste liquid pipe 40.

The first guard 33, the second guard 34 and the third guard 35 approach one another while keeping extremely small clearances between the upper end portions thereof, the folded portion 35*c* of the third guard 35 horizontally overlaps with the upper end portion 63*b* of the second guide portion 63 and the folded portion 63*c* of the second guide portion 63 horizontally overlaps with the upper end portion 61*b* of the first guide portion 61, whereby the DIW is prevented from infiltrating into the space between the first guide portion 61 and the second guide portion 63 and the space between the second guide portion 63 and the third guard 35.

In the final rinsing treatment, the exhaust pipe 38 is forcibly exhausted, whereby the downflow flowing down in the treatment chamber 3 is introduced into the exhaust tub 30 through a clearance between the third guard 35 and the sidewall of the exhaust tub 30 and exhausted through the exhaust pipe 38.

As hereinabove described, the atmosphere around the wafer W is exhausted through the second recovery port 93, the first recovery port 92 and the waste liquid port 91 opposed to the peripheral edge portion of the wafer W in the chemical solution treatments at the steps S4, S6 and S8, and hence exhaust efficiency for the mist of each chemical solution in each chemical solution treatment is relatively high. Upon termination of the final rinsing treatment, however, the atmosphere in the chemical solution treatment area CA (particularly the atmosphere around the wafer W located on the chemical solution treatment position (the position shown in FIG. 1)) contains the mists of the chemical solutions, i.e., the hydrofluoric acid, the SPM and the SC1 to no small extent. When dried and crystallized on the surface of the wafer W, the mists of the chemical solutions form particles to contaminate the wafer W.

Therefore, the drying treatment (spin drying) is performed on the wafer W in the drying treatment area DA whose atmosphere is separated from that of the chemical solution treatment area CA. The drying treatment is now more specifically described.

When a prescribed final rinsing time elapses from the start of the supply of the DIW, the control unit 80 closes the DIW valve 21, to stop supplying the DIW to the wafer W. Further, the control unit 80 drives the DIW nozzle driving mechanism 25, and the DIW nozzle 1 is returned to the retracted position on the side of the treatment cup 5. In addition, the control unit 80 drives the holding member lifting mechanism 87, to move up the wafer W held by the substrate holding member 4 from the chemical solution treatment position (the position of the wafer W shown in FIG. 1) to the drying treatment position (the position of the wafer W shown in FIG. 2) (step S11).

The control unit 80 further opens the CDA valve 29, to discharge the CDA from the discharge ports 26A of the CDA units 26 and the CDA nozzles 109 (step S11). The discharge ports 2A of the FFUS 2 and the discharge ports 26A of the CDA units 26 are formed on positions immediately above the drying treatment position (the position of the wafer W shown in FIG. 2) for the wafer W, whereby the clean air and the CDA are sprayed onto the wafer W located on the drying treatment position from above. The CDA and the clean air fill up the drying treatment area DA, to keep the drying treatment area DA at positive pressure. The atmosphere in the drying treatment area DA has relatively low humidity, due to the supply of the CDA.

After the substrate holding member 4 is moved up to the drying treatment position (the position of the wafer W shown in FIG. 2), the control unit 80 accelerates the wafer W to a spin drying speed (3000 rpm, for example). Thus, the drying treatment is performed for centrifugally draining the DIW adhering to the surface of the rinsed wafer W and drying the wafer W (step S12). In the drying treatment, the DIW splashing from the peripheral edge of the wafer W is received by the trough 100, and adheres to the outer wall of the trough 100.

In the drying treatment, the drying treatment area DA is kept at positive pressure, whereby the mists of the chemical solutions in the chemical solution treatment area CA can be prevented from infiltrating into the drying treatment area DA.

Further, the wafer W is dried in a state where the humidity of the atmosphere is relatively low, due to the supply of the CDA. Formation of particles is suppressed as the humidity in the atmosphere is reduced, whereby adhesion of particles to the wafer W can be reduced in the drying treatment.

After the drying treatment is performed over a prescribed drying time, the control unit 80 controls the motor 8, to stop rotating the wafer W (step S13). Further, the control unit 80 closes the CDA valve 29, to stop supplying the CDA from the discharge ports 26A of the CDA units 26 and the CDA nozzles 109 (step S13). In addition, the control unit 80 drives the holding member lifting mechanism 87, to move down the substrate holding member 4 to the substrate transfer position (the position shown in FIG. 3) (step S14). Thereafter the wafer W is transferred from the substrate holding member 4 located on the substrate transfer position to the substrate transport robot TR, and discharged from the treatment chamber 3 by the substrate transport robot TR (step S15).

According to the embodiment, as hereinabove described, the substrate holding member 4 is vertically moved by the holding member lifting mechanism 87 between the chemical solution treatment area CA and the drying treatment area DA. The wafer W is treated with the chemical solutions in the chemical solution treatment area CA, and dried in the drying treatment area DA. The atmospheres of the chemical solution treatment area CA and the drying treatment area DA are separated from each other, whereby the wafer W can be dried in the atmosphere containing no mists of the chemical solutions. Thus, adhesion of particles to the wafer W can be suppressed or prevented in the drying treatment.

In the drying treatment performed in the drying treatment area DA, the DIW splashing from the peripheral edge portion of the wafer W is received by the trough 100 provided in the drying treatment area DA. Thus, contamination resulting from splashing of the DIW (the DIW containing the chemical solutions) eliminated from the wafer W can be prevented. Further, the DIW (the DIW containing the chemical solutions) from the wafer W does not splash into the chemical solution treatment area CA positioned under the drying treatment area DA. Thus, the chemical solution treatment area CA can be prevented from contamination resulting from the drying treatment on the wafer W.

Further, the CDA is supplied to the drying treatment area DA from the CDA units 26 and the CDA nozzles 109. In addition, the clean air is supplied to the drying treatment area DA from the FFUS 2. Therefore, the drying treatment area DA is kept at positive pressure. Thus, the mists of the chemical solutions in the chemical solution treatment area CA can be prevented from infiltrating into the drying treatment area DA.

In addition, the CDA is supplied to the drying treatment area DA in the drying treatment, whereby the wafer W is dried in the atmosphere having relatively low humidity. Formation of particles is suppressed as the humidity in the atmosphere is reduced, whereby adhesion of particles to the wafer W can be reduced in the drying treatment.

While the embodiment of the present invention has been described, the present invention may be embodied in other ways.

For example, while the CDA is supplied to the drying treatment area DA as the low-humidity gas in the aforementioned embodiment, low-humidity $N_2$ gas may be supplied in place of the CDA. Also in this case, the humidity of the atmosphere in the drying treatment area DA can be reduced, whereby adhesion of particles to the wafer W can be more effectively suppressed.

While the clean air is regularly supplied from the FFUS 2 in the resist removing treatment and the low-humidity gas is supplied in the drying treatment in addition to the clean air in the aforementioned embodiment, only the low-humidity gas may be supplied in the drying treatment, and only the clean air from the FFUS 2 may be supplied in the remaining treatments (the chemical solution treatments and the rinsing treatments) for example.

While the CDA is supplied to the drying treatment area DA from both of the CDA units 26 and the CDA nozzles 109 in the aforementioned embodiment, the CDA may be supplied from either the CDA units 26 or the CDA nozzles 109.

In the aforementioned embodiment, the supply of the low-humidity gas to the drying treatment area DA may be omitted, so that only the clean air from the FFUS 2 is supplied to the drying treatment area DA.

While the resist removing treatment is performed for removing the unnecessary resist from the surface of the wafer W with the SPM in the aforementioned embodiment, other treatments, such as washing treatments, with chemical solutions may be performed on the wafer W. As the chemical solutions, an SC2 (a hydrochloric acid-hydrogen peroxide mixture), buffered hydrofluoric acid (buffered HF: a mixture of hydrofluoric acid and ammonium fluoride) and the like can be illustrated, in addition to the aforementioned hydrofluoric acid and SC1.

While the DIW is employed as the rinsing solution in the aforementioned embodiment, carbonated water, electrolytic ionized water, hydrogen water, magnetic water or ammonia water having a diluted concentration (about 1 ppm, for example) can be employed in place of the DIW.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2008-202762 filed with the Japanese Patent Office on Aug. 6, 2008, the disclosure of which is introduced herein by reference.

What is claimed is:

1. A substrate treatment apparatus comprising:
    a treatment chamber provided therein with a chemical solution treatment area for treating a substrate with a chemical solution and a drying treatment area provided above the chemical solution treatment area for drying the substrate;
    a substrate holding member vertically movably provided in the treatment chamber for holding the substrate horizontally;
    a lifting mechanism vertically moving the substrate in the range between the chemical solution treatment area and the drying treatment area;
    a chemical solution supply mechanism for supplying the chemical solution to the substrate held by the substrate holding member positioned in the chemical solution treatment area;
    a cup provided in the chemical solution treatment area to surround the periphery of the substrate holding member positioned in the chemical solution treatment area;
    a substrate rotating mechanism for rotating the substrate held by the substrate holding member around a vertical axis of rotation;
    a solution receiving portion, provided in the drying treatment area to surround the periphery of the substrate holding member positioned in the drying treatment area, for receiving a solution splashing from the substrate rotated by the substrate rotating mechanism, the solution receiving portion being mounted on a ceiling face of the treatment chamber; and
    a gas supply mechanism for supplying a low-humidity gas into the drying treatment area, the gas supply mechanism including a plurality of nozzles which are arranged laterally with respect to the substrate holding member and positioned in the drying treatment area, and which are arranged at intervals in a peripheral direction of the substrate holding member, the plurality of nozzles having respective discharge ports directing inward in a radial direction of the substrate rotation to discharge the low-humidity gas inward in the radial direction.

2. The substrate treatment apparatus according to claim 1, further comprising a substrate transport mechanism for introducing/discharging the substrate into/from the treatment chamber, wherein
    the substrate holding member transfers/receives the substrate to/from the substrate transport mechanism on a substrate transfer position set between the chemical solution treatment area and the drying treatment area.

3. The substrate treatment apparatus according to claim 1, further comprising an exhaust mechanism for exhausting the atmosphere in the solution receiving portion.

4. The substrate treatment apparatus according to claim 3, wherein a cylindrical vertical plate is formed upright vertically in the solution receiving portion for collecting the solution.

5. The substrate treatment apparatus according to claim 1, wherein the solution receiving portion includes an annular trough having an annular lower wall, and the plurality of nozzles are arranged directly above the lower wall.

6. The substrate treatment apparatus according to claim 1, wherein the solution receiving portion includes an annular trough having a cylindrical vertical sidewall suspended downward from the ceiling face of the treatment chamber, and an annular lower wall protruding from a lower end of the sidewall inward in the radial direction.

7. The substrate treatment apparatus according to claim 6, wherein the lower wall includes a horizontal portion connected to the lower end of the sidewall to horizontally extend, and an inclined portion connected to the horizontal portion and directed upward toward an inner side in the radial direction.

8. The substrate treatment apparatus according to claim 7, wherein the solution receiving portion further includes a cylindrical vertical plate formed vertically upright from a boundary portion between the horizontal portion and the inclined portion, and the vertical plate and the inclined portion define a reservoir groove for collecting the treatment solution splashing from the substrate.

9. The substrate treatment apparatus according to claim 8, further comprising an exhaust mechanism for exhausting the atmosphere in the solution receiving portion, wherein the exhaust mechanism includes an exhaust pipe connected to the sidewall of the trough and having an end which opens in an inner surface of the sidewall.

\* \* \* \* \*